(12) United States Patent
Shirata

(10) Patent No.: US 6,882,403 B1
(45) Date of Patent: Apr. 19, 2005

(54) LITHOGRAPHY SYSTEM AND METHOD

(75) Inventor: Yosuke Shirata, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/684,898

(22) Filed: Oct. 10, 2000

Related U.S. Application Data

(63) Continuation of application No. 09/350,923, filed on Jul. 12, 1999, now abandoned, which is a continuation of application No. 09/055,954, filed on Apr. 7, 1998, now abandoned.

(30) Foreign Application Priority Data

Apr. 7, 1997 (JP) .............................................. 9-103814

(51) Int. Cl.$^7$ ........................... G03B 27/52; G03B 27/42
(52) U.S. Cl. ...................................................... 355/30
(58) Field of Search ................................ 355/27–30, 53; 118/715–722; 396/611

(56) References Cited

U.S. PATENT DOCUMENTS

| | | | |
|---|---|---|---|
| 4,690,528 A | 9/1987 | Tanimoto et al. ........... 353/101 |
| 4,704,348 A | 11/1987 | Koizumi et al. ............ 430/327 |
| 4,825,247 A | 4/1989 | Kemi et al. .................... 355/55 |
| 5,243,377 A | * 9/1993 | Umatate et al. .............. 355/53 |
| 5,580,695 A | 12/1996 | Murata et al. ........... 430/270.1 |
| 5,828,572 A | * 10/1998 | Hasegawa et al. ..... 364/468.24 |
| 5,871,587 A | * 2/1999 | Hasegawa et al. .......... 118/719 |
| 5,876,280 A | 3/1999 | Kitano et al. ............... 454/187 |
| 5,877,843 A | 3/1999 | Takagi et al. ................. 355/30 |
| 5,892,572 A | 4/1999 | Nishi .......................... 355/67 |
| 6,133,981 A | * 10/2000 | Semba ........................ 355/27 |

* cited by examiner

Primary Examiner—Henry Hung Nguyen
(74) Attorney, Agent, or Firm—Westerman, Hattori, Daniels & Adrain, LLP

(57) ABSTRACT

A lithography system of in-line type includes environment sensors disposed within a chamber in which an exposure apparatus body is housed and a chamber in which a coater/developer body is housed. During a lithography process, on the basis of measured values such as air pressure temperature and humidity measured by the environment sensors, and environment control portion controls air conditioning portions in such a manner that the environmental conditions in the chambers becomes substantially the same as each other. Whereby, even when a wafer is transferred through a connecting portion, the environmental conditions in the chambers do not badly influence each other.

29 Claims, 2 Drawing Sheets

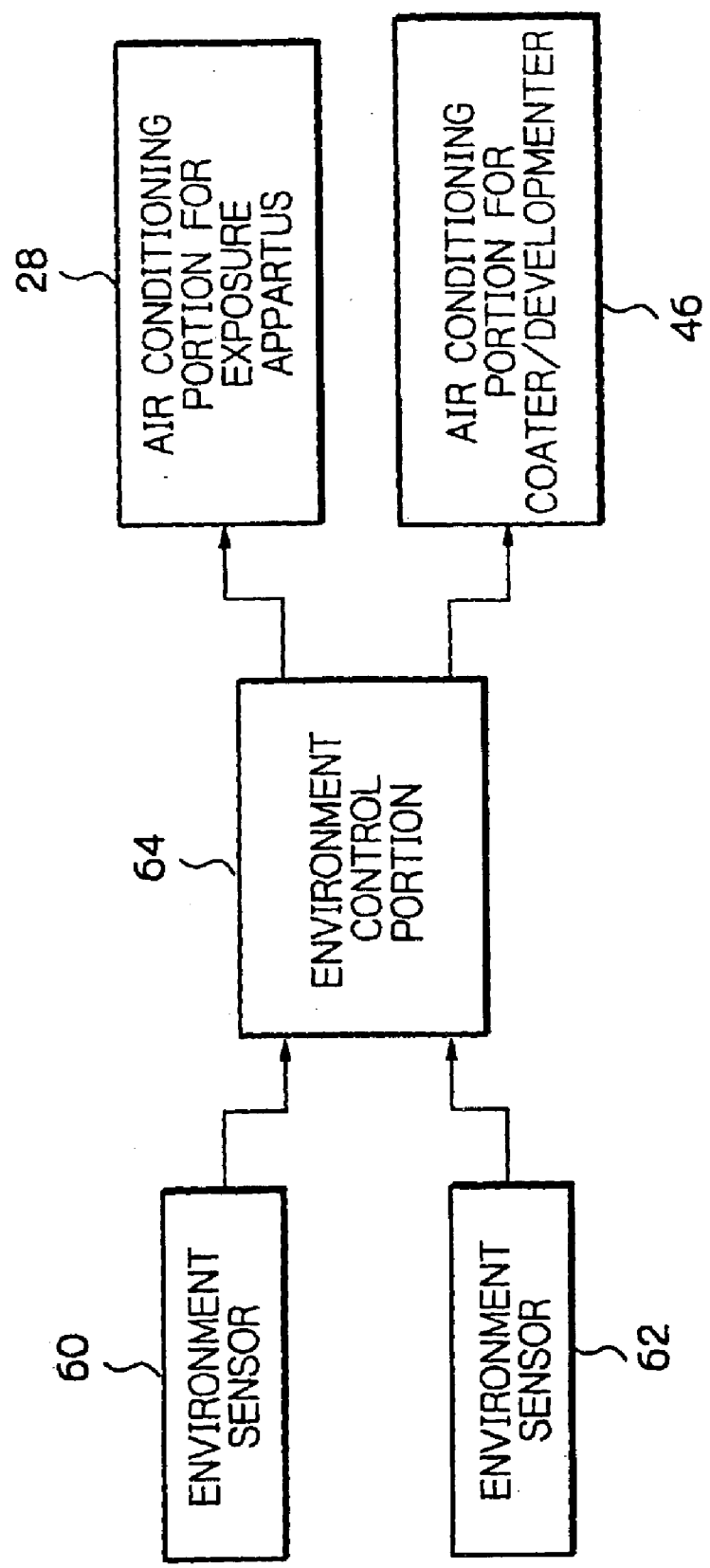

LITHOGRAPHY SYSTEM AND METHOD

This application is a continuation of prior application Ser. No. 09/350,923 filed Jul. 12, 1999, now abandoned, which is a continuation of prior application Ser. No. 09/055,954 filed Apr. 7, 1998, now abandoned.

BACKGROUND OF THE INVENTION

The present invention relates to a lithography system, and more particularly, it relates to a lithography system having an exposure apparatus for exposing a substrate to project a pattern onto it on which resist is coated, and a substrate processing apparatus connected to the exposure apparatus and adapted to process the substrate.

In a lithography process mainly effected by an exposure apparatus to manufacture semi-conductor elements and the like, resist is coated on a surface of a substrate such as a wafer by a coater, and, after the substrate is transferred, by a conveying system, to the exposure apparatus, where the exposure process is effected, the exposed substrate is further developed by a developer. In this way, a resist pattern is formed on the substrate. Recently, a so-called coater/developer in which the coater and the developer are integrally incorporated has been used mainly.

In conventional techniques, the coater/developer and the exposure apparatus are separately housed in independent chambers and have independent air-conditioners, and the chambers are controlled to achieve optimum processing conditions (air pressure, temperature, humidity and the like).

Recently, there has been a tendency that exposure light has a short wave length to cope with high density and fine arrangement of an integrated circuit, and, thus, DUV (Deep Ultra Violet) light such as excimer laser has been used as the exposure light. In correspondence to this, high sensitivity resist such as chemically amplified resist has been used as the resist relatively widely. The chemically amplified resist is very sensitive to a surrounding chemical environment and is characterized in that it is apt to react with alkaline substances within atmosphere to change its own property. Thus, in the exposure apparatuses and coater/developers using the chemically amplified resist, each chamber is normally provided with a Hepa filter for removing physical dusts and a chemical filter for removing substances (for example, alkaline substances) harmful to the chemically amplified resist.

As clear from the above explanation, in the lithography process using the chemically amplified resist, it is desirable that the chemically amplified resist is not contacted with the open air or atmosphere from when the resist is coated on the substrate to when the development is completed. To this end, the exposure apparatus and the coater/developer are often assembled as an in-line system. When the exposure apparatus and the coater/developer are assembled as the in-line system, since there is a problem that a portion (connecting portion) through which the wafer is transferred between both apparatuses is influenced by the chemical environment, the connecting portion is sealingly enclosed by a cover to provide the same environment as those in the chambers of both apparatuses, while isolating the connecting portion from an external clean room environment.

However, in the in-line system used in the conventional lithography process, the exposure apparatus and the coater/developer are housed in the independent chambers, respectively, and air pressure, temperature and humidity in each chamber are independently controlled by a corresponding air conditioner. Therefore, the difference in pressure, temperature or/and humidity occurs frequently between both apparatuses, with the result that the environments in both chambers which were controlled with high accuracy affects each other to worsen the environments.

For example, in the exposure apparatus, due to the change in pressure caused by introduction of air from the coater/developer, refractive index of air is forced to change to thereby change the projection magnification of a projection optical system, with the result that the magnification control accuracy during the exposure operation is affected by a bad influence or an air fluctuation due to the change of temperature (the temperature fluctuation) occurs. As a result, since measurement error is apt to occur in laser interferometers for measuring the position of the wafer, stepping accuracy and alignment accuracy of a stage are affected by a bad influence. Also if the humidity is changed, since the refractive index is changed, the similar bad influence would occur.

On the other hand, in the coater/developer, while the optimum temperature for development must be maintained, when the air is introduced from the exposure apparatus, the optimum temperature cannot be maintained, whereby developed result would be affected by a bad influence.

SUMMARY OF THE INVENTION

An object of the present invention is to provide a lithography system of in-line type in which environmental conditions in an exposure apparatus and in a substrate processing apparatus connected to the exposure apparatus do not badly influence each other.

Another object of the present invention is to control environment in an exposure apparatus connected to a substrate processing apparatus, with high accuracy.

A further object of the present invention is to control an environment in a substrate processing apparatus connected to an exposure apparatus, with high accuracy.

To achieve the above objects, according to the present invention, there is provided a lithography system comprising an exposure apparatus (20) which exposes a substrate (W) to project a pattern onto it on which resist is coated, a substrate processing apparatus (40) connected to the exposure apparatus and adapted to process the substrate (W), an environment sensor (60, 62) which measures an environment of at least one of the exposure apparatus (20) and the substrate processing apparatus (40), and a control device (64) which controls the environment of at least one of the exposure apparatus (20) and the substrate processing apparatus (40) on the basis of a measured value given from the environment sensor in such a manner that the environment in the exposure apparatus (20) becomes substantially the same as the environment in the substrate processing apparatus (40).

With this arrangement, the environment of at least one of the exposure apparatus and the processing apparatus is measured, and the environment of at least one of the exposure apparatus and the substrate processing apparatus is controlled by the control device on the basis of the measured value given from the environment sensor in such a manner that the environment in the exposure apparatus becomes substantially the same as the environment in the substrate processing apparatus. Thus, even when the substrate is transferred between the exposure apparatus and the substrate processing apparatus, there arises no bad influence between these apparatuses, thereby always processing the substrate correctly in the apparatuses.

In this case, although the environment sensor may be provided in the exposure apparatus or the processing apparatus, it is desirable that the environment sensor is disposed in the vicinity of a connecting portion between the exposure apparatus and the processing apparatus.

In the above-mentioned lithography system, although the environment sensor may measure any environment in the apparatus(es), it is desirable that the environment sensor (60, 62) measures at least one of air pressure, temperature and humidity in the apparatus.

That is to say, the air pressure, temperature and humidity in the apparatus are great influencing factors among environmental conditions affecting an influence between both apparatuses, and, thus, it is more desirable that at least one of the air pressure, temperature and humidity (preferably, all of them) in one apparatus becomes the same as that (or those) in the other apparatus.

Although the processing apparatus of the lithography system is not limited to a particular processing apparatus so long as it is an apparatus for processing a substrate before exposure or after exposure can be processed. For example, it is desirable that the processing apparatus has at least one of a resist coating function and a developing function. In the apparatus having such resist coating function and developing function, since the environmental conditions such as pressure, temperature and humidity in the apparatus must be controlled precisely, when the control is effected in such a manner that the environmental conditions in both apparatuses become substantially the same, excellent advantages can be achieved.

In the lithography system, the resist coated on the substrate is not defined in particular, but it is desirable to use a chemically amplified resist. Although the chemically amplified resist has high sensitivity to cope with DUV exposure, excimer laser exposure, X-ray exposure or electron beam exposure, it is very sensitive to the surrounding chemical environment (particularly, apt to react with alkaline substances). Therefore, it is required that the chemical environment in the exposure apparatus becomes the same as the chemical environment in the processing apparatus. That is to say, since the chemically amplified resist is required to be disposed within the environment from which harmful chemical substances (alkaline substances in this case) are to be removed from the time when the resist was coated on the substrate to the time when the development is completed. Therefore, by providing chemical filters for removing harmful chemical substances in both the exposure apparatus and the processing apparatus, the chemical environments in both apparatuses can be made the same.

The present invention further relates to a lithography method for controlling an environment in an exposure apparatus which is adapted to expose a substrate and which is connected to a substrate processing apparatus which processes the substrate before or after exposure, the method comprising the steps of obtaining data regarding the environment in said substrate processing apparatus; and controlling the environment in said exposure apparatus on the basis of the obtained data.

The present invention further relates to a lithography method for controlling an environment in a substrate processing apparatus which is adapted to process a substrate before or after exposure and which is connected to an exposure apparatus which exposes the substrate before or after the processing, the method comprising the steps of obtaining data regarding the environment in said exposure apparatus; and controlling the environment in said processing apparatus on the basis of the obtained data.

The present invention further relates to a method for making an exposure apparatus which is adapted to expose a substrate and which is connected to a substrate processing apparatus which processes the substrate before or after exposure, the method comprising the steps of providing an adjusting device which adjusts an environment in said exposure apparatus; and providing a control device which controls said adjusting device on the basis of data regarding the environment in said substrate processing apparatus.

The present invention further relates to a method for making a substrate processing apparatus which is adapted to process a substrate and which is connected to an exposure apparatus which exposes the substrate before or after the processing, the method comprising the steps of providing an adjusting device which adjusts an environment in said substrate processing apparatus; and providing a control device which controls said adjusting device on the basis of data regarding environment in said exposure apparatus.

The present invention further relates to a lithography method using an exposure apparatus which exposes a substrate and a substrate processing apparatus which processes the substrate before or after exposure, the method comprising the steps of obtaining data regarding an environment in one of said exposure apparatus and said substrate processing apparatus; and controlling the environment in the other apparatus on the basis of the obtained data.

The present invention further relates to an exposure apparatus adapted to expose a substrate and connected to a substrate processing apparatus which processes the substrate before or after exposure, the exposure apparatus comprising a chamber disposed around an exposure body system which exposes the substrate; an adjusting device connected to said chamber and adapted to adjust an environment in said chamber; and a control device connected to said adjusting device and adapted to control said adjusting device on the basis of data regarding the environment in said substrate processing apparatus.

The present invention further relates to a substrate processing apparatus adapted to process a substrate and connected to an exposure apparatus which exposes the substrate before or after the substrate processing, the substrate processing apparatus comprising a chamber disposed around a substrate processing body system which processes the substrate an adjusting device connected to said chamber and adapted to adjust an environment in said chamber; and a control device connected to said adjusting device and adapted to control said adjusting device on the basis of data regarding environment in said exposure apparatus.

BRIEF DESCRIPTION OF THE DRAWINGS

FIG. 2 is a block diagram of an environment control portion and other portions associated with it, of the lithography system of FIG. 1.

DESCRIPTION OF THE PREFERRED EMBODIMENTS

Figure 1:
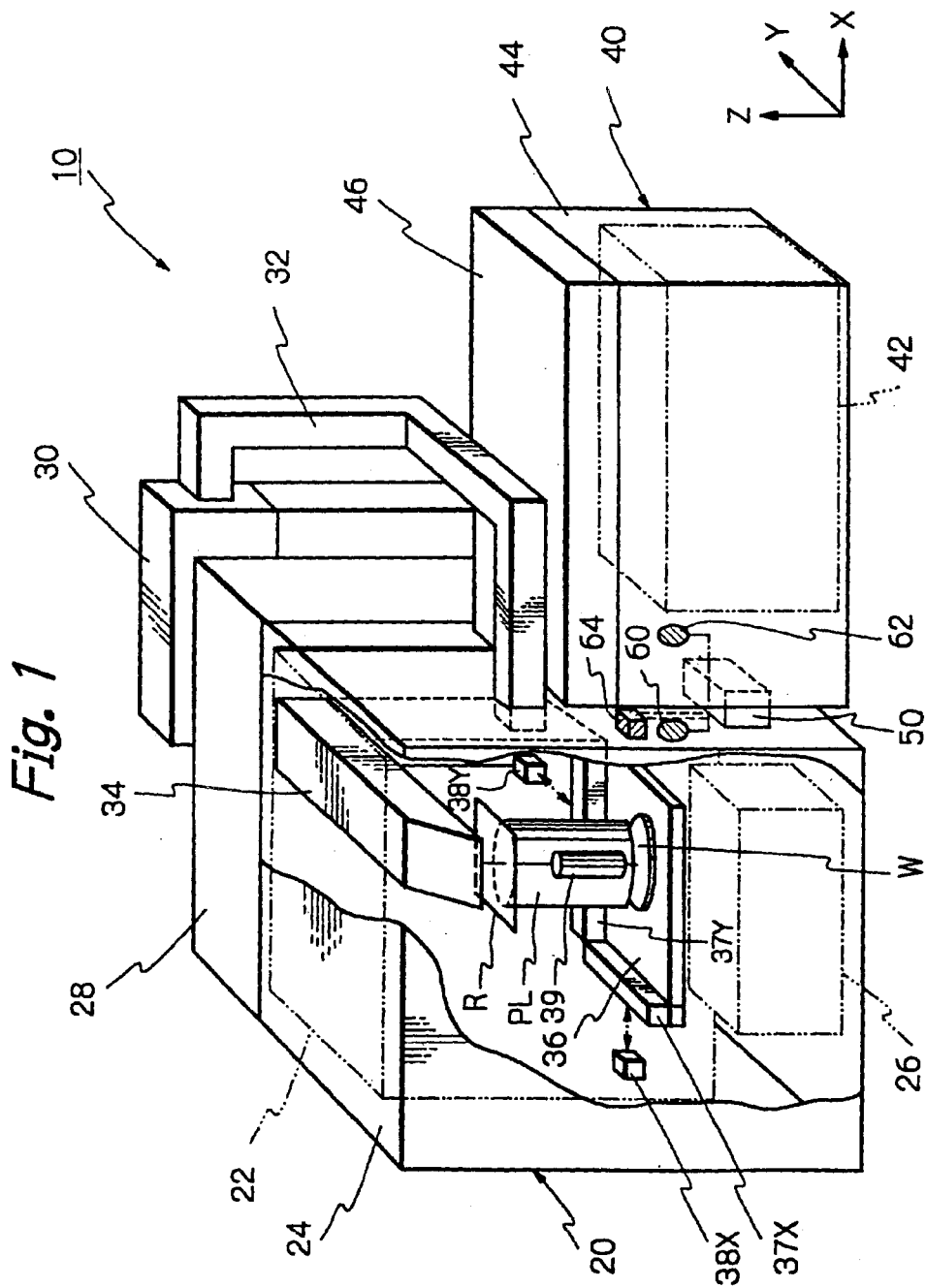
FIG. 1 is a schematic perspective view of a lithography system according to a preferred embodiment of the present invention.

Now, a preferred embodiment of the present invention will be explained with reference to the accompanying drawings.

FIG. 1 is a schematic perspective view of a lithography system according to a preferred embodiment of the present invention.

The lithography system 10 includes an exposure apparatus 20 for effecting exposure in a step-and-repeat manner, a coater/developer 40 as a processing apparatus for effecting development after resist was coated on a wafer W and the exposure was effected, and a connecting portion 50 for connecting the exposure apparatus 20 to the coater/developer 40 and for providing a sealed space through which the wafer W is transferred. That is to say, the exposure apparatus 20 and the coater/developer 40 are assembled to form as an in-line system.

The exposure apparatus 20 includes an exposure chamber 24 for the exposure apparatus, and an exposure apparatus body 22 and a wafer loader 26 which are housed in the exposure chamber 24. An air conditioning portion 28 for the exposure apparatus is disposed adjacent to the exposure chamber 24, and air conditioning (air adjustment) of the exposure chamber 24 is performed by an air conditioner (not shown) in the air conditioning portion 28.

The air conditioning portion may be an air conditioning portion described in U.S. Ser. No. 08/824,467 filed on Mar. 26, 1997.

An excimer laser 30 disposed out of the exposure chamber 24 is used as an exposure light source of the exposure apparatus body 22, and a laser beam emitted from the excimer laser 30 is directed to the exposure apparatus body 22 through a beam matching unit (BMU) 32. The laser beam (exposure light) introduced into the exposure apparatus body 22 is uniformly illuminated onto a pattern area on a reticle R through an illumination optical system 34. As a result, a pattern formed on the reticle R is projected onto a predetermined shot area on the wafer (substrate) on which resist was coated, through a projection optical system PL.

The wafer W is held on a wafer stage by vacuum suction via a wafer holder (not shown), which wafer stage can be shifted in an X-direction (left-and-right direction in FIG. 1) and a Y-direction (right-and-inclined backward direction in FIG. 1). X, Y positions of the wafer W are accurately measured with a predetermined resolving power (for example, 0.5–1 nm) by an X interferometer 38X and a Y interferometer 38Y through an X shift mirror 37X disposed on the wafer stage 36 and extending in the Y-direction and a Y shift mirror 37Y extending in the X-direction, respectively.

The wafer loader 26 serves to convey (i.e., load and unload) the wafer W with respect to the wafer stage 36 of the exposure apparatus body 22 and to transfer the wafer W between the exposure apparatus body 22 and a coater/developer body 42 through the connecting portion 50.

The air conditioning portion 28 for the exposure apparatus serves to control the interior of the exposure chamber 24 to a predetermined pressure value which is positive (pressure) with respect to an external clean room. This is done because external dusts are prevented from entering the exposure apparatus body 22 and the pressure in the chamber is prevented from changing during the exposure operation to prevent the change in refractive index of light, thereby effecting proper exposure. Further, in the air conditioning portion 28 of the exposure apparatus, when the air in the exposure chamber 24 is circulated by a blower constituting a part of the air conditioner (not shown), the temperature in the chamber 24 is controlled to a predetermined value by adjusting not only cooling of air effected by a cooler constituting a part of the air conditioner but also heating of air effected by a heater. The temperature control of the exposure chamber 24 is effected within a range of about $\pm 1/10°$ C. with respect to the predetermined temperature value. Further, in the air conditioning portion 28 of the exposure apparatus, humidity in the chamber 24 is controlled to a predetermined value. In this case, however, the humidity is not adjusted directly, but is adjusted indirectly by controlling the pressure and temperature in the chamber 24.

A Hepa filter and a chemical filter are provided on a partition wall between the air conditioning portion 28 and the exposure chamber 24. Physical dusts are removed by the Hepa filter and substances (alkaline substances) chemically harmful to the chemically amplified resist is removed by the chemical filter, with the result that a clean condition is maintained within the exposure chamber 24 physically as well as chemically.

The coater/developer 40 includes a coater/developer chamber 44, and a coater/developer body 42 housed in the coater/developer chamber 44. An air conditioning portion 46 for the coater/developer is disposed above and adjacent to the coater/developer chamber 44, and air in the coater/developer chamber 44 is adjusted by the air conditioning portion 46 for the coater/developer.

In the coater/developer body 42, prior to the exposure, high sensitive chemically amplified resist is coated on the wafer W by a spinning manner, and, after the exposure operation, developing treatment is effected. Since the developing treatment sensitively reacts to a temperature condition to affect an influence upon a developed result, it is desirable that the developing treatment is performed at a position (where the developing treatment is not influenced by the change in temperature) remote from the connecting portion 50 (described later) between the coater/developer and the exposure apparatus 20. Similar to the air conditioning portion 28 for the exposure apparatus, the air conditioning portion 46 for the coater/developer serves to maintain the pressure, temperature and humidity in the coater/developer chamber 44 at the predetermined values.

Further, since the Hepa filter and the chemical filter are provided on a partition wall between the air conditioning portion 46 and the chamber 44, physical dusts and chemically harmful substances are removed, with the result that a clean condition is maintained within the chamber 44 physically as well as chemically.

Similar to the apparatuses 20, 40, the connecting portion 50 is sealingly closed by a cover so that, when the wafer W is transferred between the exposure chamber 24 and the coater/developer chamber 44, the wafer W on which the chemically amplified resist was coated is maintained under a clean condition physically as well as chemically.

In the illustrated embodiment, as shown in FIGS. 1 and 2, environment sensors 60, 62 for measuring environmental conditions in the chambers 24, 44 are disposed within the chambers 24, 44 in the vicinity of the connecting portion 50, and there is provided an environment control portion 64 as a control device for controlling the environmental conditions in the chambers on the basis of measured values given from the environment sensors 60, 62. The environment sensors 60, 62 are sensors capable of measuring the environmental conditions (such as pressure, temperature and humidity) in the chambers and each sensor is constituted by a barometer, a thermometer and a hygrometer. In the environment control portion 64, the difference in pressure, the difference in temperature and the difference in humidity between the chambers 24 and 44 are calculated on the basis of the measured results given from the environment sensors 60, 62. The environment control portion 64 controls the air conditioning portion 28 for the exposure apparatus and the air conditioning portion 46 for the coater/developer so that the differences of the environmental conditions in the chambers 24, 44 becomes substantially zero, thereby making the environmental conditions in the chambers 24, 44 substantially the same. In this case, the barometers, thermometers and hygrometers constituting the environment sensors 60, 62 are previously calibrated to adjust the sensitivity therebetween. With this arrangement, the difference in pressure, the difference in temperature and the difference in humidity between both apparatuses can be measured correctly.

Next, a lithography process of the lithography system 10 having the above-mentioned construction will be briefly described.

First of all, the wafer W is set on the coater/developer body 42 shown in FIG. 1. When the predetermined input is inputted by an operator through an input device (not shown) of the exposure apparatus body 22, a command is sent to the coater/developer body 42 through the in-line system, with the result that the chemically amplified resist is coated on the wafer W under the desired condition. The wafer W on which the chemically amplified resist was coated is conveyed to the connecting portion 50 and then is transferred onto the wafer loader 26 of the exposure apparatus.

The wafer loader 26 which received the wafer W rests the wafer W on the wafer stage 36 of the exposure apparatus body 22. In this condition, the laser beam from the excimer laser 30 is directed to the illumination optical system 34 through the BMU 32, thereby illuminating the pattern area on the reticle R. As a result, the pattern on the reticle R is projected with a reduced scale onto the wafer set on the wafer stage 36 through the projection optical system PL.

Since the exposure apparatus body 22 according to the illustrated embodiment is a stepper, the wafer stage 36 is steppingly shifted successively in accordance with the exposure sequence to successively expose a plurality of shot areas on the wafer. In this way, the exposure process is repeated.

When the exposure regarding second and other layers is effected, since alignment marks as well as the pattern were already printed on the wafer W, after several number of alignment marks are measured by an alignment sensor 39, a shot arrangement on the wafer is calculated on the basis of a measured result from the alignment sensor by using a so-called enhanced-global-alignment (EGA) techniques. On the basis of this shot arrangement, an overlap exposure operation is effected while shifting the wafer stage 36 in a step manner. When the stepping and alignment are performed, the position of the wafer stage 36 is controlled on the basis of positional information from the laser interferometers 38X, 38Y.

After the reticle pattern was exposed on all of the shot areas of the wafer, the wafer W is conveyed again from the wafer stage 36 to the connecting portion 50 by the wafer loader 26 and is transferred to the coater/developer body 42 disposed within the coater/developer chamber 44. In the coater/developer body 42, the transferred wafer W is developed with a desired condition. After the development, the wafer W is conveyed to a wafer removing position (not shown) in the coater/developer chamber 44 and then is advanced to a next processing stage.

In the lithography system 10 according to the illustrated embodiment, the lithography process as mentioned above is effected. During the lithography process, the air conditioning portion 28 for the exposure apparatus and the air conditioning portion 46 for the coater/developer are always controlled by the environment control portion 64 in such a manner that the environmental conditions (such as pressure, temperature and humidity) in both chambers 24, 44 become substantially the same. For example, if the difference in pressure between both chambers 24 and 44 is generated, the rotation of the fans in the air conditioning portion 28 for the exposure apparatus and the air conditioning portion 46 are controlled, or dimensions of variable air introduction openings (not shown) of the air conditioning portions for introducing external air are controlled in such a manner that the difference in pressure between the chambers 24 and 44 becomes substantially zero. Further, if the difference in temperature or humidity is generated, the coolers, heaters and fans of both air conditioning portions 28, 46 are controlled in such a manner that the difference in temperature or humidity becomes substantially zero.

In the illustrated embodiment, both chambers 24 and 44 are interconnected and the connecting portion 50 through which the wafer W is transferred is sealingly covered. Thus, so long as the environmental conditions in both chambers 24, 44 are the same as each other, when the wafer W is transferred, even if both chambers 24, 44 are communicated with each other, the environmental conditions (such as pressure, temperature and humidity) are hardly changed, with the result that the proper processing can be performed in the exposure apparatus body 22 and the coater/developer body 42.

As mentioned above, according to the lithography system 10 according to the illustrated embodiment, during the lithography process, the environmental conditions in the exposure chamber 24 in which the exposure apparatus body 22 is housed and in the coater/developer chamber 44 in which the coater/developer body 42 is housed are measured by using the environment sensors 60, 62 comprised of the barometer, thermometer and hygrometer which were previously calibrated with high accuracy, and both air conditioning portions 28, 46 are controlled by the environment control portion 64 on the basis of the measured results in such a manner that the environmental conditions in both chambers 24, 44 become the same. Accordingly, the environmental conditions in the chambers of the exposure apparatus and the coater/developer do not affect each other, and, particularly, in the exposure apparatus body 22, accuracy of magnification control during the exposure, stepping accuracy of the wafer stage 36 and alignment accuracy are not worsened, with the result that the exposure can be performed with high accuracy as is in the exposure apparatus 20 alone in spite of the fact that the exposure apparatus is combined with the coater/developer so as to form the in-line system.

In the lithography system 10 according to the illustrated embodiment, since the air pressures in the chambers are controlled so that there is no difference in pressure between the exposure apparatus 20 and the coater/developer 40, the dust agitation which would be caused by fresh air flowing into the connecting portion 50 can be prevented, thereby improving the yielding percentage of manufacture of the semi-conductor elements.

In the illustrated embodiment, while an example that the exposure apparatus body 22 and the coater/developer body 42 are housed within one chamber, respectively, was explained, the present invention is not limited to such an example, but, for example, the exposure apparatus body and the wafer loader portion 26, or the coater portion, developer portion and conveying portion and the like may be housed in separate chambers, respectively. In this case, particularly, the command from the environment control portion 64 may be sent to air conditioners for controlling environmental conditions in each of chambers of two apparatuses which are interconnected via a portion (similar to the connecting portion 50) through which the wafer is transferred.

Further, in the illustrated embodiment, while an example that the environmental conditions in the exposure chamber 24 and the coater/developer chamber 44 are adjusted by using the air conditioning portion 28 for the exposure apparatus and the air conditioning portion 46 for the coater/developer was explained, the present invention is not limited to such an example, but, there may be provided devices capable of adjusting the environmental conditions such as air pressure, temperature and humidity in the chambers independently from the air conditioning portions.

In the illustrated embodiment, while an example that the air pressures in the respective chambers are measured by the barometer to calculate the difference in pressure was explained, the difference in pressure may be directly measured by using a differential pressure gauge.

Further, in the illustrated embodiment, while an example that the environment sensors 60, 62 are disposed, respectively, within both chambers of the exposure apparatus and the coater/developer was explained, the present invention is not limited to such an example, but, an environment sensor may be disposed within one of the chambers (for example, coater/developer chamber) and the environment control portion 64 may effect the control so that the environment condition in this chamber approaches to a target value of the environmental condition in the chamber of the other apparatus (for example, exposure apparatus).

Incidentally, in the illustrated embodiment, while an example that the environmental conditions measured by the environment sensors 60, 62 are air pressure, temperature and humidity was explained, the environmental conditions are not limited to such air pressure, temperature and humidity (three conditions), other environmental conditions may be measured to coincide the environmental conditions in both chambers with each other. Further, all of the above-mentioned three conditions are not necessarily measured, but, only the air pressure and temperature may be measured to effect the controlled, or only the pressure may be measured and the control may be effected so that the difference in pressure between both chambers becomes zero. The reason is that, if the difference in pressure between both chambers becomes zero, since flow-in and flow-out of air would not occur between both chambers. Therefore, even if there are some difference in temperature and/or humidity, the influence of the difference in temperature and/or humidity would not become so great.

In the illustrated embodiment, while an example that the exposure apparatus body 22 constituting the lithography system is the stepper was explained, the present invention is not limited to such an example, but, a scan exposure apparatus of step-and-scan type may be used, thereby capable of obtaining the same effect as the illustrated embodiment.

As mentioned above, according to the present invention, an excellent lithography system of in-line type in which environmental conditions in an exposure apparatus and a substrate processing apparatus connected to the exposure apparatus do not badly influence each other can be provided.

The entire disclosure of Japanese Patent Application No. 9(1997)-103,814 filed on Apr. 7, 1997 including specification, claims, drawings and summary is incorporated herein by reference in its entirety.

What is claimed is:

1. A lithography system comprising:
   an exposure apparatus which projects a pattern on to a substrate on which resist is coated,
   a substrate processing apparatus provided adjacent to said exposure apparatus which processes the substrate;
   a first chamber containing the exposure apparatus therein;
   a second chamber provided adjacent to the first chamber separately from said first chamber and which contains the substrate processing apparatus therein;
   an environment sensor provided in at least one of the first and the second chambers which measures an environment of at least a portion in said at least one of the first and the second chambers; and
   a control device electrically connected to the environment sensor, said control device controlling the environment in said at least the other of the first and the second chambers on the basis of a measured value given from said environment sensor in such a manner that the environment of one of said substrate processing apparatus and said exposure apparatus becomes the same as the environment of the other apparatus.

2. A lithography system according to claim 1, wherein said environment sensor measures at least one of pressure, temperature and humidity in said at least one of the first and the second chambers.

3. A lithography system according to claim 2, wherein said substrate processing apparatus has at least one of a resist coating function and a developing function.

4. A lithography system according to claim 3, wherein the resist coated on the substrate is chemically amplified resist.

5. A lithography system according to claim 2, wherein the control device at least controls said environment on the basis of the measured value given from said environment sensor provided near a portion where said first chamber and said second chamber are connected to each other.

6. A lithography system according to claim 1, wherein the resist coated on the substrate is chemically amplified resist.

7. A lithography method for controlling an environment in an exposure apparatus which exposes a substrate and which is provided adjacent to a substrate processing apparatus which processes the substrate before or after exposure, the method comprising the steps of:
   obtaining data regarding the environment of at least a portion in a processing chamber in which said substrate processing apparatus is provided; and
   controlling the environment in an exposure chamber in which said exposure apparatus is provided and which is provided separately from the processing chamber, on the basis of the obtained data in such a manner that the environment in said exposure chamber becomes the same as the environment in said processing chamber.

8. A method according to claim 7, wherein said substrate processing apparatus includes at least one of a coater which coats sensitive agent on the substrate before the exposure and a developer which develops the substrate after the exposure.

9. A method according to claim 7, wherein the data relates to at least one of air pressure, temperature and humidity.

10. A method according to claim 7, wherein said exposure apparatus and said substrate processing apparatus are assembled as an in-line system.

11. A method according to claim 7, wherein chemically amplified resist is coated on the substrate.

12. A lithography method for controlling an environment in a substrate processing apparatus which processes a substrate before or after exposure, said substrate processing apparatus being provided adjacent to an exposure apparatus which exposes the substrate before or after the processing, the method comprising the steps of:
   obtaining data regarding the environment of at least a portion in an exposure chamber in which said exposure apparatus is provided; and controlling the environment in a processing chamber in which said processing apparatus is provided and which is provided separately from the exposure chamber, on the basis of the obtained data in such a manner that the environment in said substrate processing chamber becomes the same as the environment in said exposure chamber.

13. A method according to claim 12, wherein the processing apparatus includes at least one of a coater which coats sensitive agent on the substrate before the exposure and a developer which develops the substrate after the exposure.

14. A method according to claim 12, wherein the data relates to at least one of air pressure, temperature and humidity.

15. A method according to claim 12, wherein the data relates to at least one of air pressure, temperature and humidity.

16. A method according to claim 12, wherein said exposure apparatus and said processing apparatus are assembled as an in-line system.

17. A method for making an exposure apparatus which exposes a substrate, said exposure apparatus being provided adjacent to a substrate processing apparatus contained in a processing chamber which processes the substrate before or after exposure of the substrate, the method comprising the steps of:

providing an exposure body in an exposure chamber different from the processing chamber, the exposure body performing an exposure operation of the substrate;

providing an adjusting device which adjusts an environment in said exposure chamber; and providing a control device which controls said adjusting device on the basis of data regarding the environment in said processing chamber in such a manner that the environment in said exposure chamber becomes the same as the environment in said processing chamber.

18. A method according to claim 17, wherein said substrate processing apparatus includes at least one of a coater which coats sensitive agent on the substrate before the exposure and a developer which develops the substrate after the exposure.

19. A method according to claim 17, wherein the data relates to at least one of air pressure, temperature and humidity.

20. A method for making a substrate processing apparatus which processes a substrate and which is provided adjacent to an exposure apparatus contained in an exposure chamber which exposes the substrate before or after the processing of the substrate, the method comprising the steps of:

providing an exposure body in a processing chamber different from the exposure chamber, the processing body performing a processing operation to the substrate;

providing an adjusting device which adjusts an environment in said processing chamber; and providing a control device which controls said adjusting device on the basis of data regarding the environment in said exposure chamber in such a manner that the environment in said processing chamber becomes the same as the environment in said exposure chamber.

21. A method according to claim 20, wherein said substrate processing apparatus includes at least one of a coater which coats sensitive agent on the substrate before the exposure and a developer which develops the substrate after the exposure.

22. A method according to claim 20, wherein the data relates to at least one of air pressure, temperature and humidity.

23. A lithography method using an exposure apparatus which exposes a substrate and a substrate processing apparatus which processes the substrate before or after exposure, the method comprising the steps of:

obtaining data regarding an environment of at least a portion within a chamber of one of an exposure chamber in which said exposure apparatus is contained and a processing chamber in which said substrate processing apparatus is contained and which is provided separately from the exposure chamber; and controlling the environment in the other chamber of the exposure chamber and the processing chamber on the basis of the obtained data in such a manner that the environment in one of said exposure chamber and said processing chamber becomes the same as the environment in the other of said chambers.

24. An exposure apparatus which exposes a substrate and which is provided adjacent to a substrate processing apparatus contained in a processing chamber which processes the substrate before or after exposure of the substrate, the exposure apparatus comprising:

an exposure chamber which is separate from the processing chamber and contains the exposure apparatus;

an adjusting device connected to said exposure chamber and which adjusts an environment in said exposure chamber; and a control device electrically connected to said adjusting device and which controls said adjusting device on the basis of data regarding the environment of at least a portion in said processing chamber in such a manner that the environment in said exposure chamber becomes the same as the environment in said processing chamber.

25. A substrate processing apparatus which processes a substrate and which is provided adjacent to an exposure apparatus contained in an exposure chamber which exposes the substrate before or after the substrate processing, the substrate processing apparatus comprising:

a processing chamber which is separate from the exposure chamber and contains the substrate processing apparatus;

an adjusting device connected to said processing chamber and which adjusts an environment in said processing chamber; and a control device electrically connected to said adjusting device and which controls said adjusting device on the basis of data regarding environment of at least a portion in said exposure chamber in such a manner that the environment in said processing chamber becomes the same as the environment in said exposure chamber.

26. A lithography system comprising:

an exposure apparatus which projects a pattern on to a substrate on which resist is coated, a substrate processing apparatus which processes the substrate;

a first chamber which contains said exposure apparatus therein;

a second chamber which is arranged separately from said chamber and which contains said substrate processing apparatus therein;

a first environment sensor provided in the first chamber, which measures an environment in the first chamber;

a second environment sensor provided in the second chamber, which measures an environment in the second chamber; and a control device which is electrically connected to the first and the second environment sensors, and which controls the environment in one of the first chamber and the second chamber on the basis of a measured value given from said both environment sensors in such a manner that the environment in one of said first and second chambers becomes the same as the environment in the other of the first and second chambers.

27. A lithography system comprising:

an exposure apparatus which projects a pattern a pattern on to a substrate on which resist is coated, a substrate processing apparatus which processes the substrate;

a first chamber which contains said exposure apparatus therein;

a second chamber which is arranged separately from said first chamber and which contains said substrate processing apparatus therein;

a first environment sensor provided in the first chamber, which measures an environment in the first chamber;

a second environment sensor provided in the second chamber, which measures an environment in the second chamber;

a calculation device which is electrically connected to the first and the second environment sensors, and which calculates an environment difference between the both chambers; and a control device which is electrically connected to the calculation device and which controls the environment in one of the first chamber and the second chamber on the basis of the environment difference.

28. A substrate processing apparatus which processes a substrate, the apparatus comprising:

a processing chamber which contains said substrate processing apparatus therein;

a first environment sensor provided in the processing chamber, which measures an environment in the processing chamber; and a control device which is electrically connected to the first environment sensor and the second environment sensor that measures an environment in an exposure chamber that contains an exposure apparatus therein, the exposure apparatus exposing the substrate before or after the substrate is processed by the substrate processing apparatus, and the control device controlling the environment in the processing chamber on the basis of a measured value given from said both environment sensors in such a manner that the environment in the processing chamber becomes the same as the environment in exposure chamber.

29. A substrate processing apparatus which processes a substrate, the apparatus comprising:

a processing chamber which contains said substrate processing apparatus therein;

a first environment sensor provided in the processing chamber, which measures an environment in the processing chamber;

a calculation device which is electrically connected to the first environment sensor and a second environment sensor that measures an environment in an exposure chamber that contains an exposure apparatus therein, the exposure apparatus exposing the substrate before or after the substrate is processed by the substrate processing apparatus, and the calculation device calculating an environment difference between the both chambers, and a control device which is electrically connected to the calculation device and which controls the environment in the processing chamber on the basis of the environment difference.

* * * * *